(12) United States Patent
Lin

(10) Patent No.: US 6,849,902 B1
(45) Date of Patent: Feb. 1, 2005

(54) INPUT/OUTPUT CELL WITH ROBUST ELECTROSTATIC DISCHARGE PROTECTION

(75) Inventor: Shi-Tron Lin, Taipei (TW)

(73) Assignee: Winbond Electronics Corp., Hsinchu (TW)

( * ) Notice: Subject to any disclaimer, the term of this patent is extended or adjusted under 35 U.S.C. 154(b) by 0 days.

(21) Appl. No.: 10/796,966

(22) Filed: Mar. 11, 2004

(51) Int. Cl.$^7$ ............................................... H01L 23/62
(52) U.S. Cl. ........................ 257/355; 257/356; 257/357; 257/358; 257/365; 257/401
(58) Field of Search .............................. 257/355–358, 257/365, 401

(56) References Cited

U.S. PATENT DOCUMENTS 5,742,085 A    4/1998   Yu 6,147,369 A    11/2000  Chen et al.

Primary Examiner—Thien F Tran
(74) Attorney, Agent, or Firm—Birch, Stewart Kolasch & Birch, LLP

(57) ABSTRACT

An electrostatic discharge (ESD) protection device with enhanced ESD robustness. The ESD protection device comprises a pad, a finger-type MOS, a well stripe and a doped segment. The pad is on a semiconductor substrate of a first-conductive type. The finger-type MOS is on the semiconductor substrate and comprises drain regions, source regions and channel regions. Each drain region is of a second-conductive type and is coupled to the pad. Each source region is of the second-conductive type and coupled to a power rail. Channel regions are formed on the semiconductor, substantially parallel to each other. Each channel region is located between one source region and one drain region. The well stripe is of the second-conductive type and formed on the semiconductor, in an angle to the channel regions. The doped segment is of the first-conductive type and in the well stripe. Furthermore, the doped segment is coupled to the pad.

23 Claims, 17 Drawing Sheets

INPUT/OUTPUT CELL WITH ROBUST ELECTROSTATIC DISCHARGE PROTECTION

BACKGROUND OF THE INVENTION

1. Field of the Invention

The present invention relates to an electrostatic discharge (ESD) protection device in an integrated circuit (IC). In particular, the present invention relates to an input/output (I/O) cell capable of uniform ESD current discharge during an ESD event.

2. Description of the Related Art

ESD in electronic devices has been a major obstacle to product reliability. Electrostatic charge can accumulate in a human body, a machine or an electric device of up to several thousand volts. Contact with another, typically a grounded object, causes electrostatic discharge, which travels through a path and may damage any device along the path if the device is not well protected.

There are several known test models, such as Human Body Mode (HBM), Machine Mode (MM), and others, to simulate different conditions under which ESD occurs. An electronic device can only be certified for commercialized after passing tests of a certain level for each test model.

Each advanced IC has millions of devices in a tiny chip and, as such, is highly vulnerable to ESD stress. In order to prevent ESD damage and achieve commercial certification, each IC must be well designed and protected. FIG. 1 shows an IC. In the IC 10, core circuit 12 directs internal operation while I/O cells 14 are responsible for communication between core circuit 12 and other external ICs through pads 16 and pins (not shown). Circuit designers are primarily concerned with setting up a discharge path which is capable of both sustaining heat dissipation generated by ESD and maintaining workable thereafter. It is known that electrostatic charge generally occurs outside an IC. If it can be discharged near pads 16, where electrostatic charge first enters IC 10, it will not reach and damage core circuit 12, which is typically weaker than the I/O cells. Hence I/O cells 14 are always a topic of discussion in the art of ESD protection.

One way to provide ESD protection in an I/O cell is to utilize metal-on-semiconductor transistors (MOSs) in the post driver of an I/O cell. Referring to FIG. 2, an exemplary I/O cell with a post driver 20 and a pre-driver 18 is presented. Pre-driver 18 directs-simple logical or analog functions of the I/O cell, such as tri-state, level shift, and others. In addition to signal transferring for pre-driver 18, post driver 20 is responsible for driving a pad and a pin in an IC, the wire between the IC and another connected IC, and a pad and a pin in the connected IC, essentially forming a huge parasitic capacitor. Therefore, in a post driver capable of driving the huge parasitic capacitor, the negative-type MOS (NMOS) and the positive-type MOS (PMOS) requires a large layout area. To reduce occupied space in a silicon area, a MOS with large driving ability is typically laid out as a finger-type MOS, comprising several gate fingers 22, source regions 24 and drain regions 26. FIG. 3 illustrates an exemplary layout of a finger-type NMOS in a post driver. Each gate finger 22 is located between one of the source regions 24 and one of the drain regions 26. Regarding the ESD issue, the amount of area allocated is critical, as it must be large enough to dissipate the heat generated by ESD current to prevent burnout thereof. Due to the large area occupied by the NMOS and PMOS, the post driver is considered a suitable candidate for use as an ESD protection device. For example, in FIG. 2, while a positive ESD pulse occurs at pad 16 and VSS is grounded, the NPN BJT (bipolar junction transistor) parasitic under the NMOS "snaps back" to a low impedance condition and conducts ESD current to release ESD stress generated thereby.

Another approach is to employ a silicon controlled rectifier (SCR). SCR is famous for its low impedance and low holding voltage while "turned on". Therefore, SCR generates far less heat while turned on to conduct ESD current during an ESD event. Put simply, to achieve a certain ESD robustness or protection level, SCR requires less silicon area than other devices, offering a reduced cost. FIG. 4 shows a simple SCR connected between pad1 30 and pad2 32. The path for ESD current $I_{ESD}$ is also indicated in FIG. 4. FIG. 5 shows a modified version of SCR, which includes a NMOS 40 with a source/drain region 38 located on the junction between P-substrate 34 and N-well 36 to lower the trigger voltage of the SCR. Other ESD protection devices that at least combine a SCR with a MOS are also taught in US patents, such as U.S. Pat. No. 5,742,085 and U.S. Pat. No. 6,147,369.

SUMMARY OF THE INVENTION

An object of the present invention is to enhance ESD robustness of an IC.

Another object of the present invention is to enhance uniform turn on of a finger-type MOS transistor through interaction with a parasitic SCR structure.

Still another object of the present invention is to convert a conventional finger-type MOS transistor to form a hybrid SCR-MOS transistor structure for enhancing ESD current conduction during an ESD event.

And still another object of the present invention is to trigger the hybrid SCR-MOS transistor structure without based on a relatively high nwell-to-substrate breakdown voltage.

The semiconductor device of the present invention comprises a pad, a finger-type MOS, a well stripe and a doped segment. The pad is on a semiconductor substrate of a first-conductive type. The finger-type MOS is on the semiconductor substrate and comprises drain regions, source regions and channel regions. Each drain region is of a second-conductive type and is coupled to the pad. Each source region is also of the second-conductive type and is coupled to a power rail. Channel regions are formed on the semiconductor, substantially parallel to each other. Each channel region is located between one source region and one drain region. The well stripe is of the second-conductive type and formed on the semiconductor at an angle to the channel regions. The doped segment is of the first-conductive type and in the well stripe. Furthermore, the doped segment is coupled to the pad.

Due to the existence of the well stripe and the doped segment therein, there are several parasitic SCRs formed in the semiconductor device. The parasitic SCR enhances the fully turn on of all gate fingers of the finger-type MOS transistor, and the hybrid SCR-MOS structure can efficiently conduct large ESD current for enhanced ESD protection.

BRIEF DESCRIPTION OF THE DRAWINGS

The present invention can be more fully understood by reading the subsequent detailed description in conjunction with the examples and references made to the accompanying drawings, wherein.

DETAILED DESCRIPTION OF THE INVENTION

Figure 1:
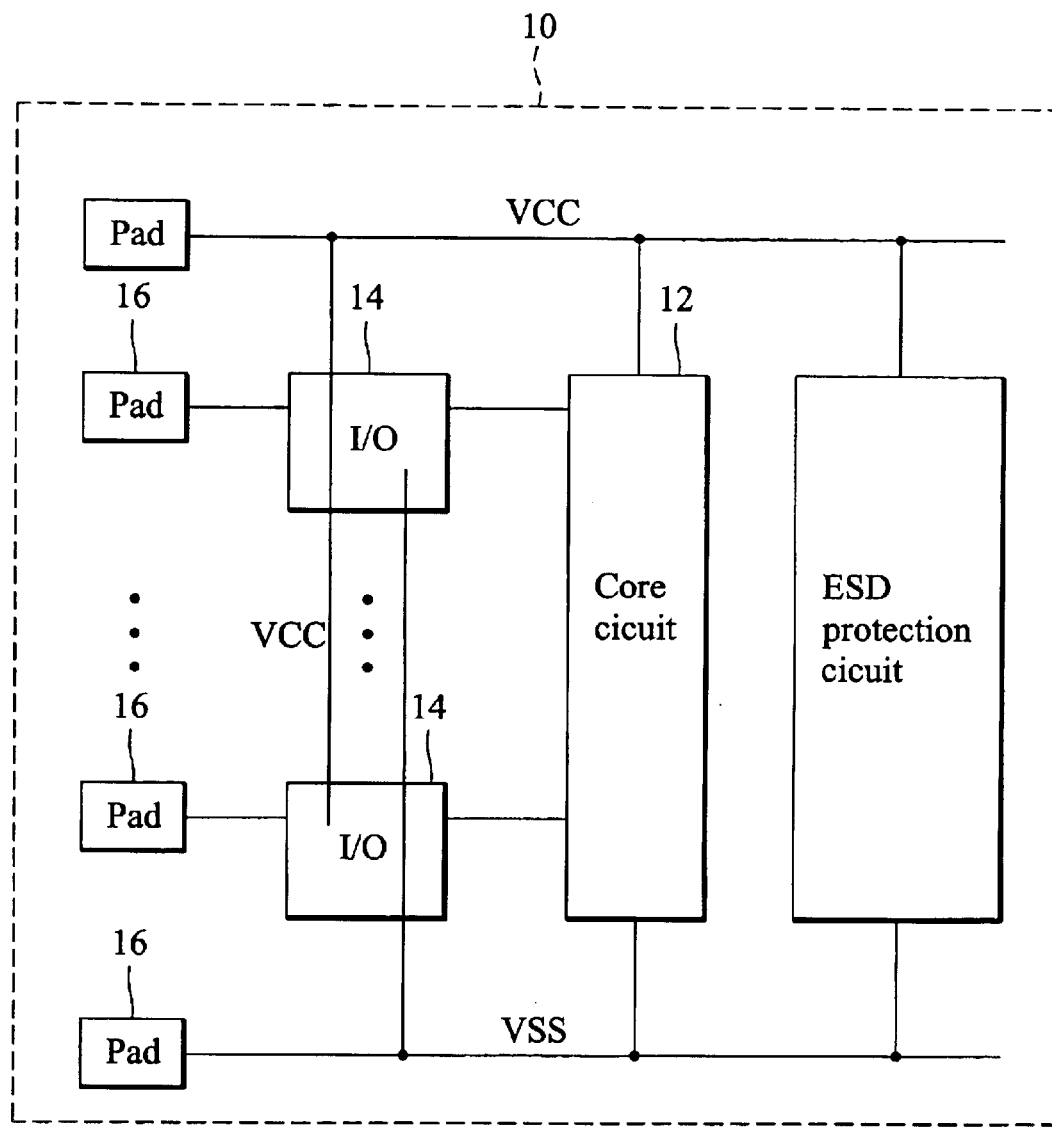
FIG. 1 shows an IC of the prior art.
Figure 2:
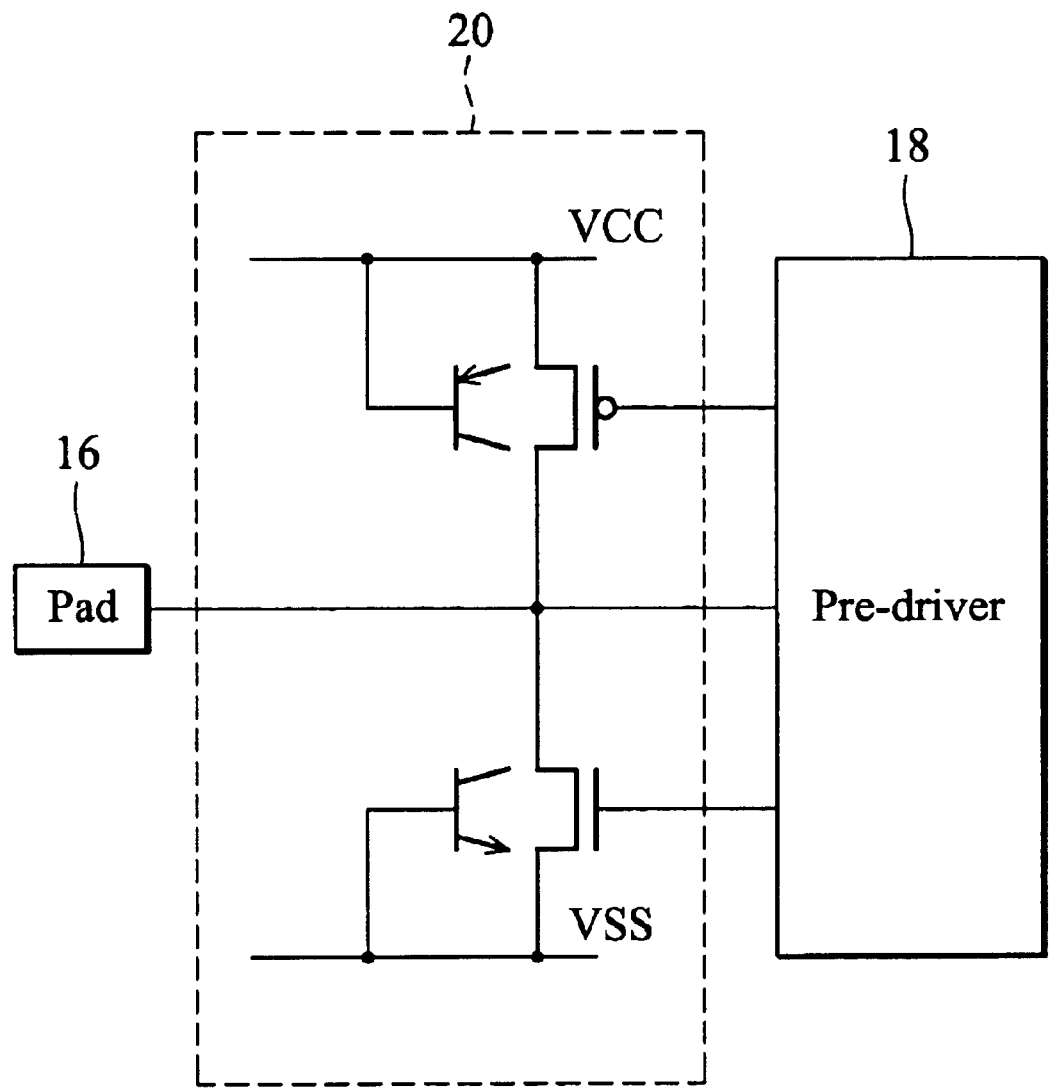
FIG. 2 presents an exemplary I/O cell with a post driver and a pre-driver.
Figure 3:
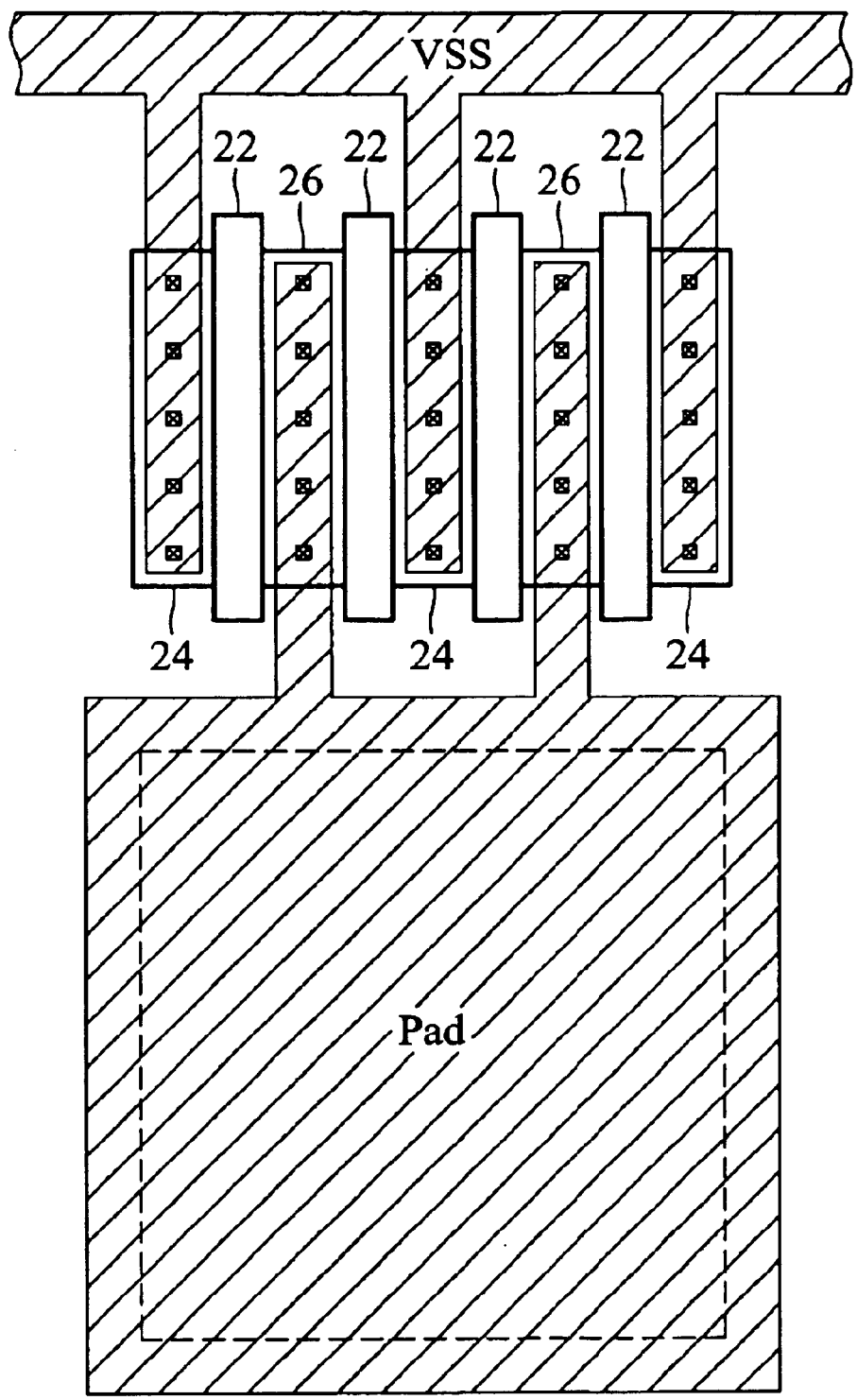
FIG. 3 shows a layout of an traditional finger-type NMOS.
Figure 4:
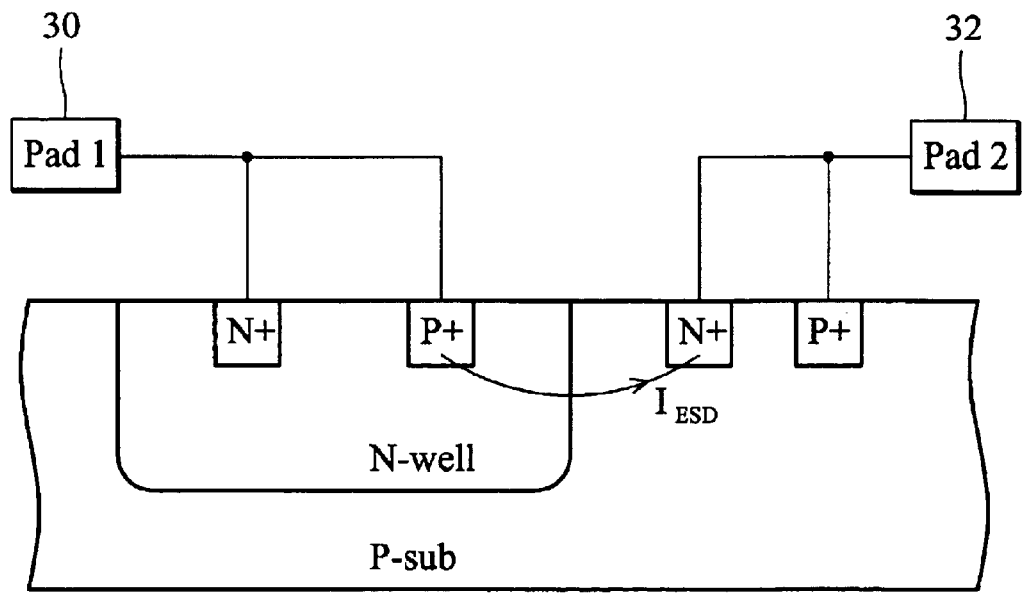
FIG. 4 shows a simple SCR connected between pad1 30 and pad2 32.
Figure 5:
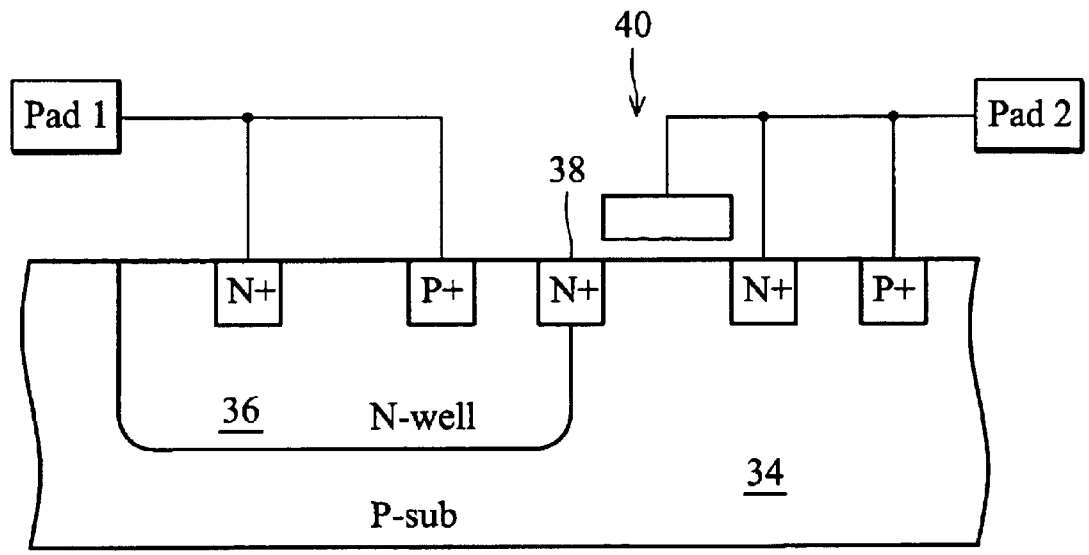
FIG. 5 shows a modified version of SCR in the related art.
Figure 6:
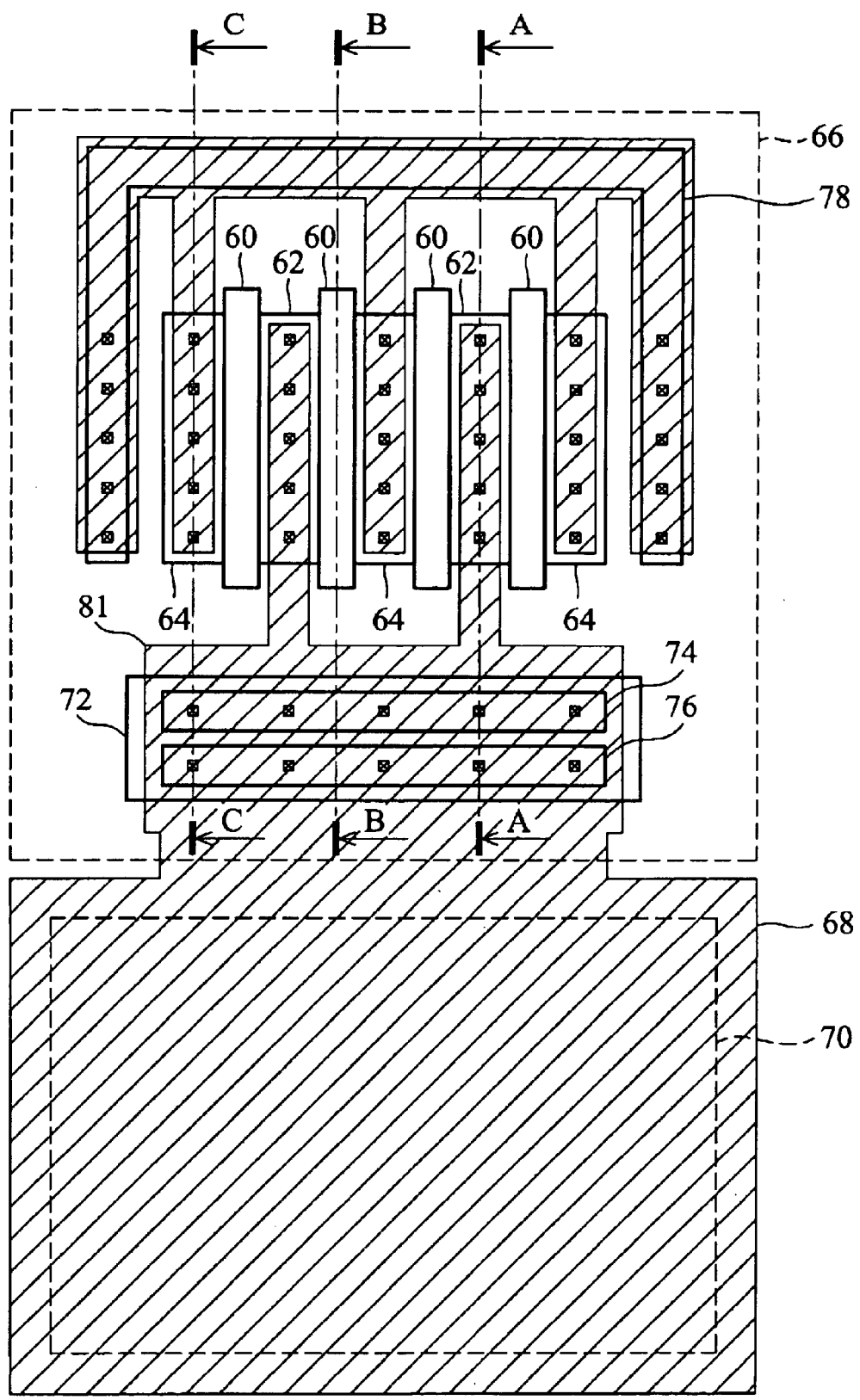
FIG. 6 depicts a layout of a first embodiment of the present invention.
Figure 7A:
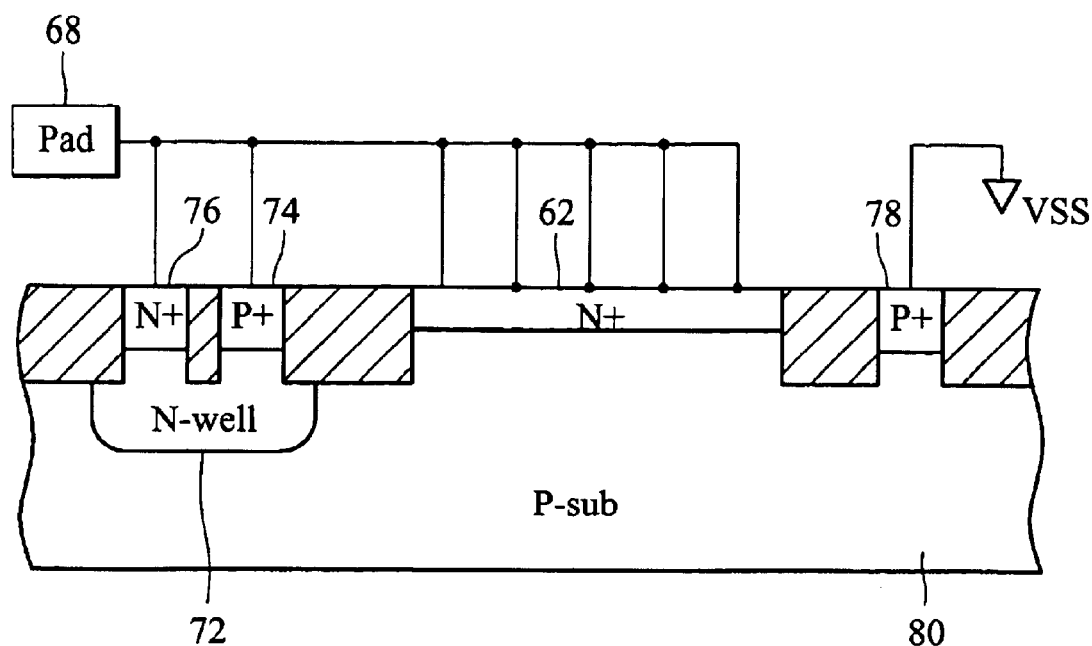
FIGS. 7A to 7C are cross sections of FIG. 6 along lines AA, BB and CC, respectively.
Figure 7B:
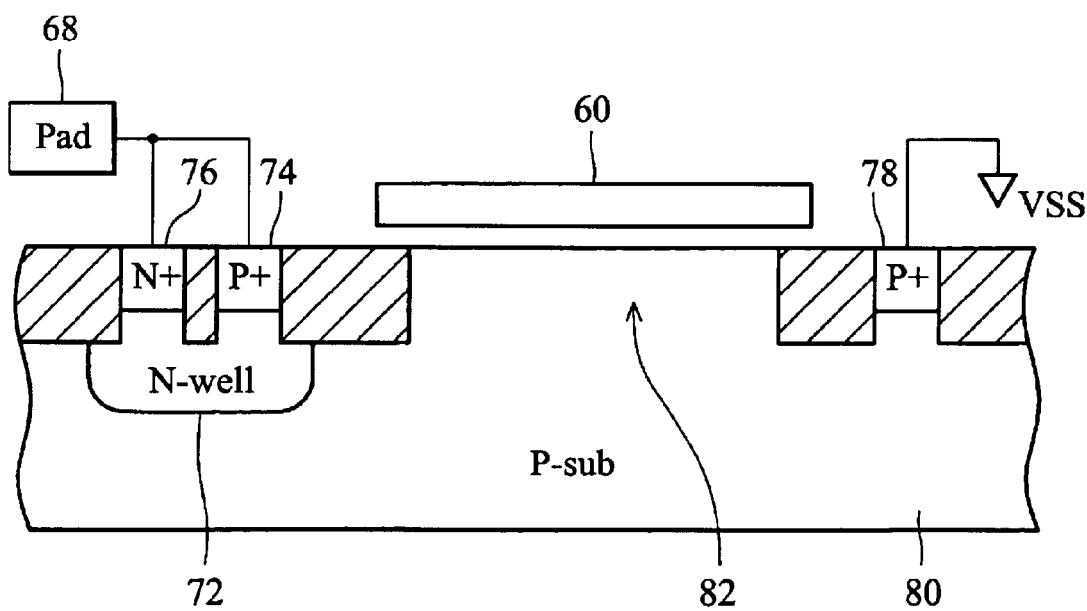
Figure 7C:
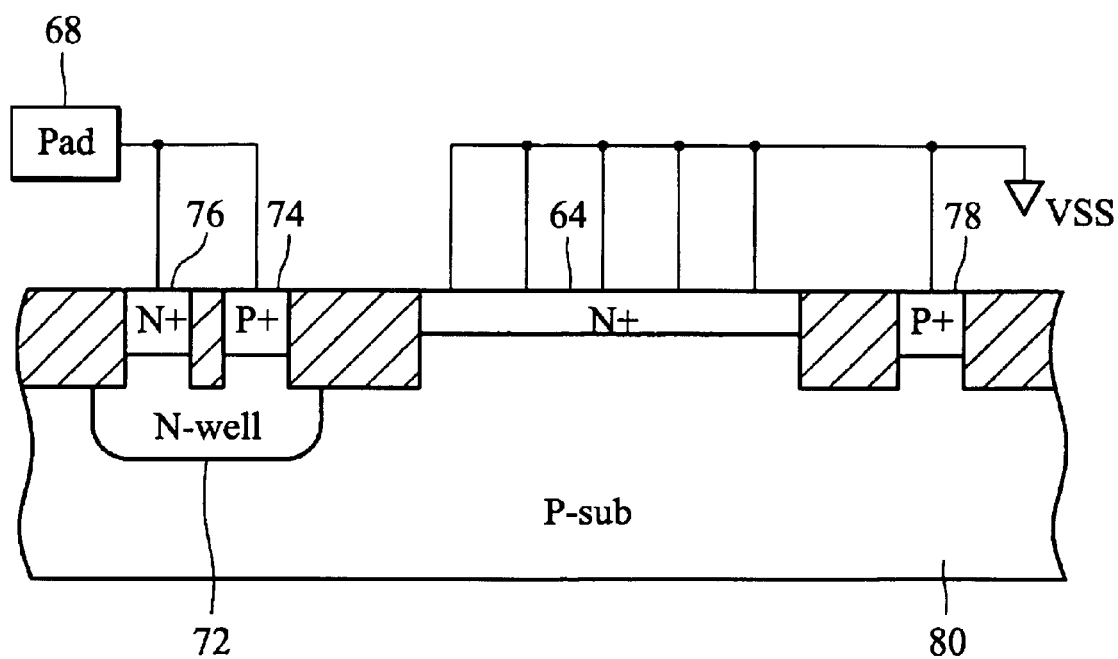

FIG. 6 depicts a layout of a first embodiment of the present invention, including an I/O cell 66 and a pad 68. FIGS. 7A to 7C are cross sections of FIG. 6 along lines AA, BB and CC, respectively. A finger-type NMOS transistor is shown in FIG. 6 as an example. Nevertheless, this invention can also be embodied by a finger-type PMOS transistor.

In FIG. 6, the finger-type NMOS has gate fingers 60, source regions 64 and drain regions 62. The finger-type NMOS transistor is formed in an active region substantially surrounded by an isolation region. Source regions 64 and drain regions 62 are of N-type. Through contacts and metal wires, source regions 64 are connected to a power rail, VSS, and drain regions 62 to pad 68, on which an opening 70 is formed in a passivation layer (not shown). Each gate finger 60 is located on a channel region between one source region 64 and one drain region 62. Gate fingers 60 are substantially parallel to each other. Gate fingers 60 can be connected either to a pre-driver to serve as a driver during a normal power-on operation or to VSS to remain inactive during the normal power-on operation. The number of gate fingers being connected to a signal line of the pre-driver depends on the driving requirement of the I/O cell, varying from zero to all.

Each source region 64 is preferably of elongated shape, with a length dimension (in a conventionally defined channel width direction) preferably at least 10 times a width dimension (in another direction perpendicular to the channel width direction). Alternatively, the length dimension is at least 5 times the width dimension. Still alternatively, the length dimension is at least twice the width dimension. The benefits of elongated-shape source regions will become apparent with the following disclosures.

An N-well stripe 72 is located between pad 68 and the finger-type NMOS. N-well stripe 72 includes a P+ region 74 (as a doped segment) and a N+ region 76 (as a contact region for N-well stripe 72) formed therein. P+ region 74 is closer to the finger-type NMOS than N+ region 76. N-well stripe 72 is preferably substantially perpendicular to gate fingers 60. The N-well region is therefore preferably extending substantially perpendicular to a channel width direction of a channel under one of the gate fingers 60. Metal segment 81 is above N-well stripes 72 and connects drain regions 62, P+ region 74, N+ region 76 and pad 68.

The N-well stripe 72 is spaced apart form the source region 64 by a gap. Preferably, the gap is less than 2.1 um or in the range of 2.1 um to design-rule minimum, to reduce parasitic SCR conduction resistance. Alternatively, the gap can be less than 5.1 um. Still alternatively, the gap can be less than 20.1 um. The bigger the gap, the higher barrier for parasitic SCR trigger will be, and the higher the SCR trigger current and conduction resistance will be.

A P+ pickup ring 78 substantially surrounds the finger-type NMOS, located on three sides of the finger-type NMOS and substantially absent on the side facing pad 68. P+ pickup ring 78 is connected to VSS.

In FIG. 7A, drain region 62, P+ region 74 and N+ region 76 are located in series on P substrate 80 and separated by shallow trench isolation (STI) regions. Drain region 62, P+ region 74 and N+ region 76 are connected to pad 68 while P+ pickup ring 78 is coupled to VSS. FIG. 7B indicates that a gate finger 60 is on a channel region 82. FIG. 7C shows that source region 64 is connected to VSS. Please note that, in FIG. 7B, there is parasitic SCR between pad 68 and VSS, formed by P+ region 74, N-well stripe 72, P-substrate 80 and N+ source region 64. In other words, where there is a source region 64 in FIG. 6 there is a parasitic SCR.

When a positive ESD pulse occurs at pad 68 and VSS is grounded, the NPN BJTs parasitic under gate fingers 60 are transiently triggered and turned into snap-back, as mentioned previously. When this occurs, P-substrate 80 is at a voltage level high enough to turn on the NPN BJTs. This voltage level, typically 0.7 Volt, induces electrons injected from N+ source regions 64 into the p-substrate 60. Most of the injected electrons are absorbed by the nearby drain regions 62 as in an ESD-triggered BJT. Nevertheless, a small portion of electrons go into N-well stripe 72, due to the substantially perpendicular arrangement of N-well stripe 72 relative to gate fingers 60 and their adjacent source regions. Once the electron flow from source regions 64 into N-well stripe 72 is large enough, the N-well stripe has a voltage level low enough to trigger on the parasitic SCRs and conduct ESD current. In view of pad 68 and VSS, only when current conducted by the parasitic BJTs is large enough can the parasitic SCRs be triggered. This SCR trigger current is much larger than the MOSFET trigger current and can be adjustable by altering the location of N-well stripe 72 and the patterns therein.

As disclosed earlier, the source regions are preferably elongated with a larger length dimension than a width dimension. During an ESD event, the loner the length dimension, the less percentage of the electrons injected from the source region into the substrate will be absorbed by the N-well stripe 72, and thus the higher the trigger current to turn on parasitic SCR will be. Preferably, the use of an elongated shape source region with a sufficient length is beneficial for increasing the trigger current of the parasitic SCR to avoid accidental triggering of the parasitic SCR.

One of the benefits of the instant invention is that, during a positive-voltage ESD event when at least one parasitic SCR is triggered, the forward biasing of the p+ segment in the Nwell stripe injects lots of holes into the p-substrate through the Nwell stripe and cause local substrate potential build up that induce forward biasing of each MOS source regions. As a result, all gate fingers of the MOS transistor and all parasitic SCRs are turned on during the ESD event. Thus the hybrid SCR-MOS structure are fully turned on to conduct very large ESD transient current.

Secondly, the addition of N-well strips can be easily implemented by modifying the layout of a conventional I/O cell without increasing the layout area. Between the finger-type NMOS and the pad 68 is a forbidden zone, in which, according to design rules, no active devices can be formed. The forbidden zone exists to prevent a short to a nearby pad due to mechanical bonding on the pad. In FIG. 6, since the N-well stripe 72 has already been coupled to pad 68 via P+ region 74 or N+ region 76, and it is basically the same electrical node as the pad, so there is no concern if it is further shorted to the pad metal due to the misalignment and pressure of the wire bonding process. Therefore, N-well stripe 72 can be located inside the forbidden zone without causing additional silicon area. As an example, a conventional IC packaging rule specifies keeping active regions away from a pad metal by 12 um. As another example, a COB (Chip-On-Board) packaging rule specifies keeping active regions away from a pad metal by 20 um or 25 um.

Optionally, the p+ region 74 and n+ region 76 can be butting together (with zero spacing). This option reduces the effective resistance from underneath the p+ region to the n+ region within the nwell stripe 72, and can increase the SCR trigger current for less chance of accidental latch-up triggering.

Another option is that the n+ region 76 can be omitted and leaving only the p+ region 74 in the nwell stripe 72. The p+ region 74 and the nwell stripe 72 can still form a part of the parasitic SCR.

Still optionally, the drain-contact-to-channel spacing can be kept larger than the source-contact-to-channel spacing (not illustrated in FIG. 6). This is a well known industry practice for adequate drain ballast resistance.

Figure 8:
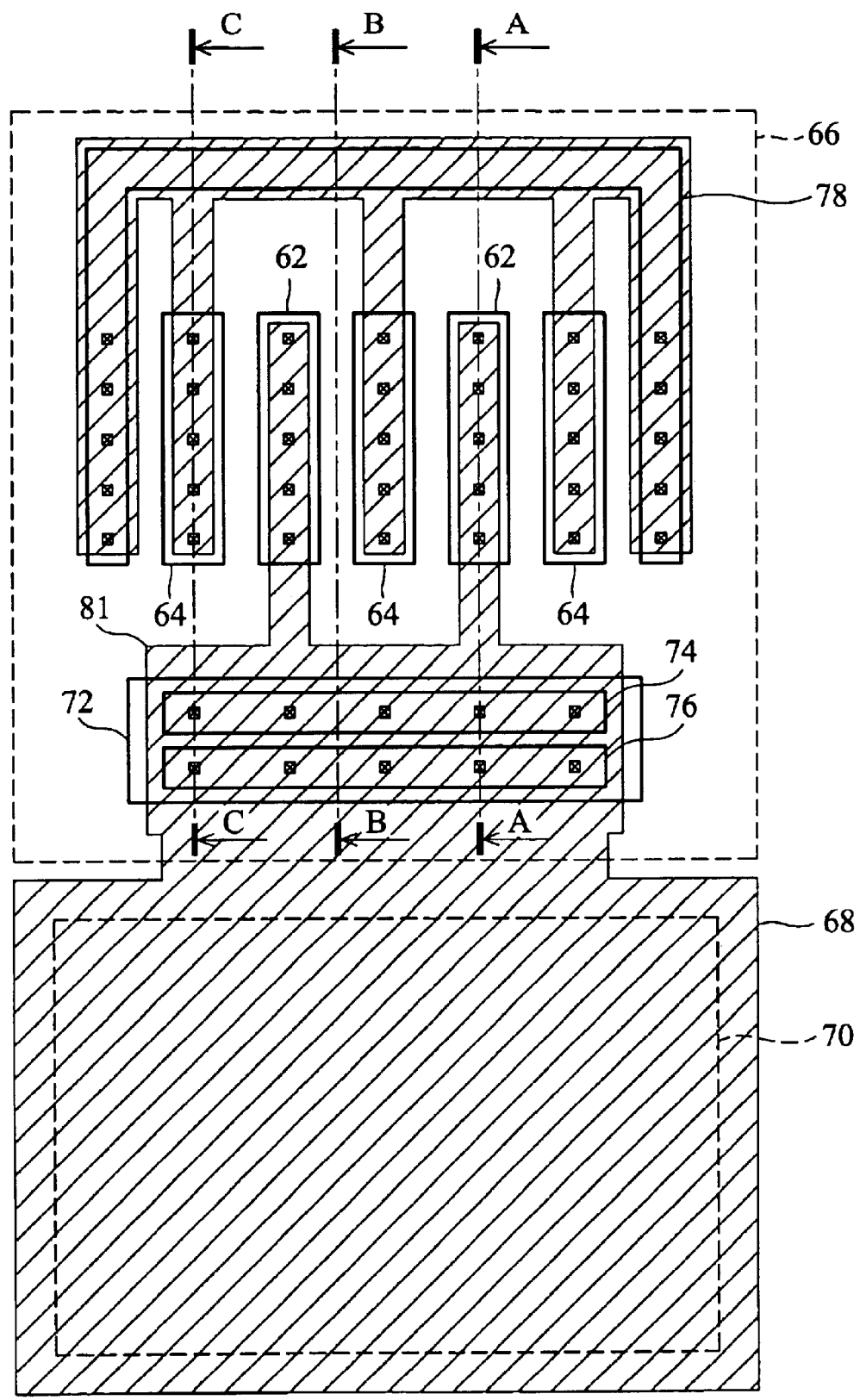
FIG. 8 depicts a layout of a second embodiment of the present invention.
Figure 9A:
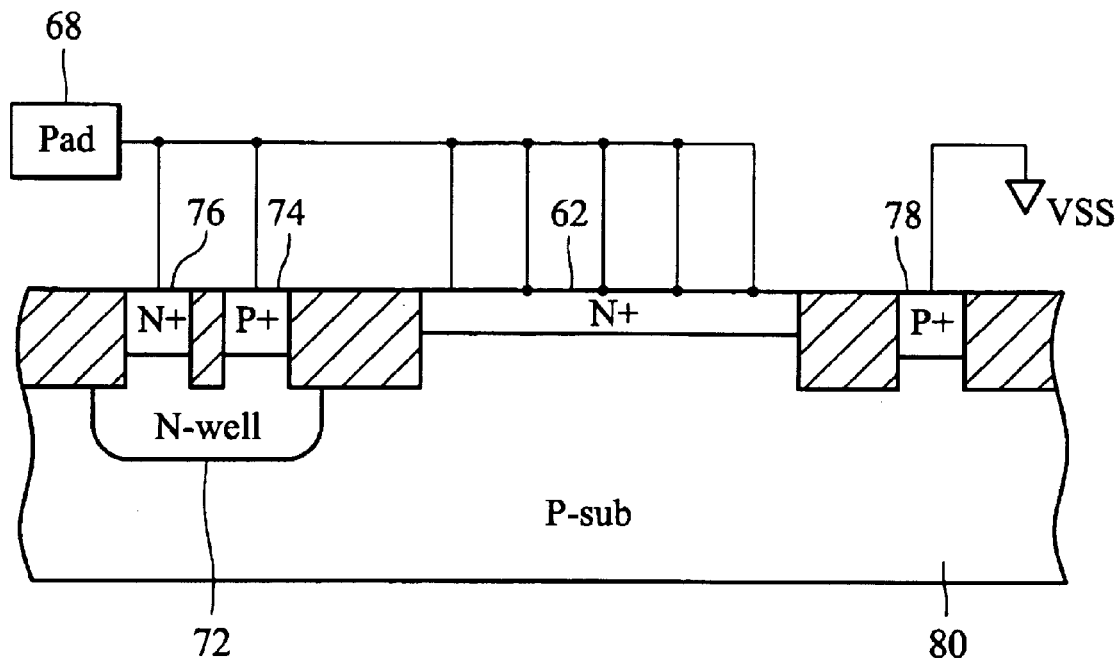
FIGS. 9A to 9C are cross sections of FIG. 8 along lines AA, BB and CC, respectively.
Figure 9B:
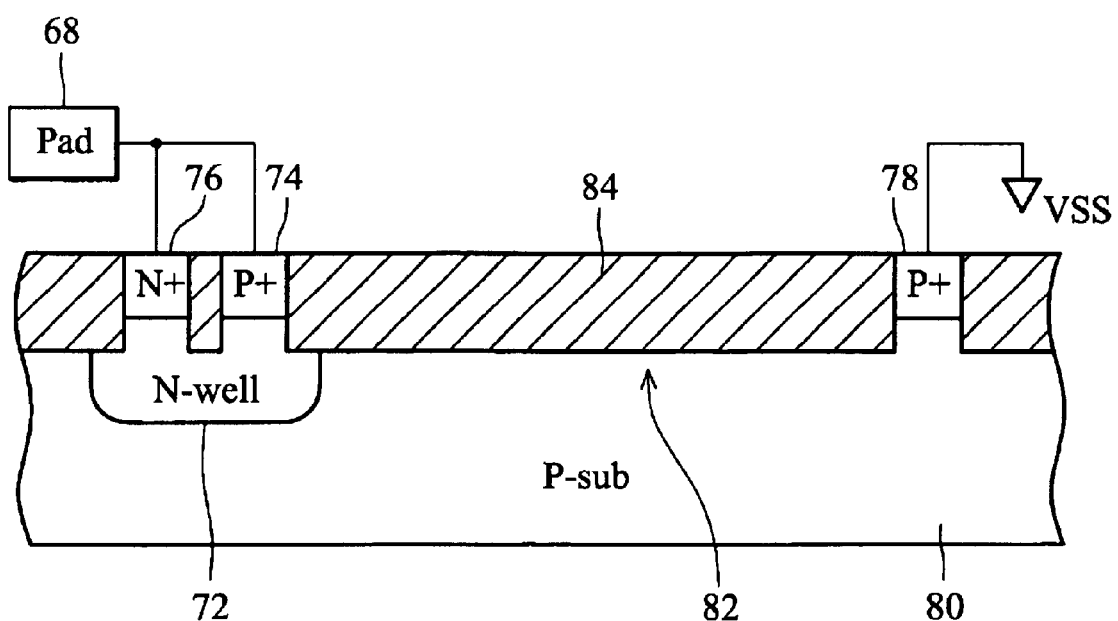
Figure 9C:
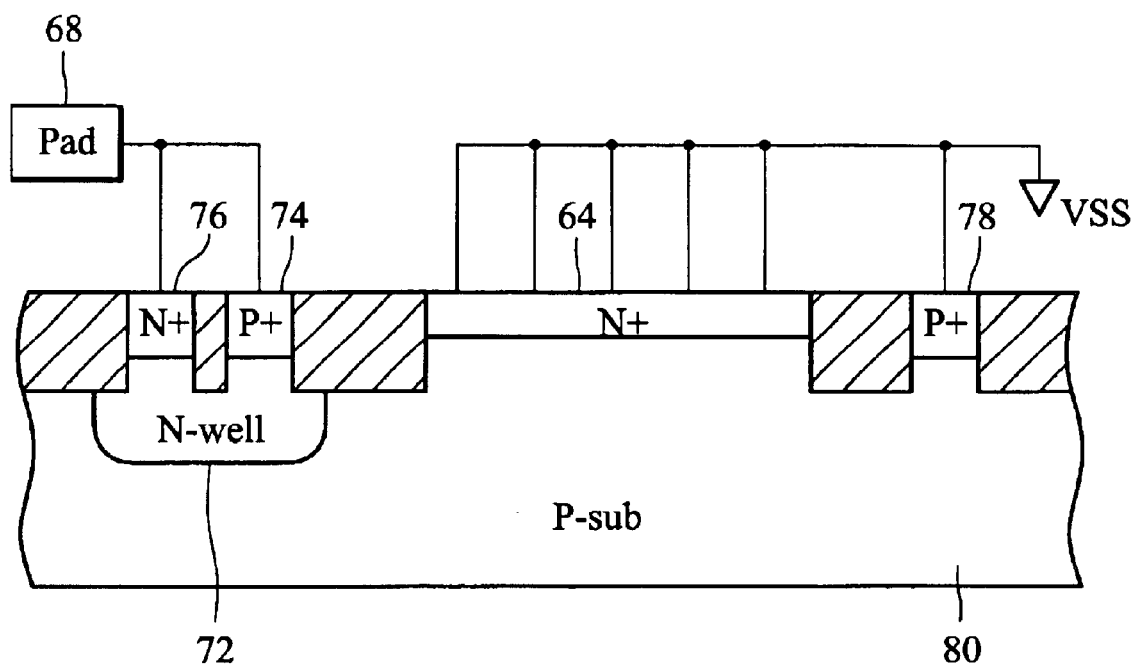

FIG. 8 depicts a layout of a second embodiment of the present invention. FIGS. 9A to 9C are cross sections of FIG. 8 along lines AA, BB and CC, respectively. The finger-type NMOS can be replaced by a field device. Gate fingers in FIG. 6 are replaced by a field-oxide-isolation stripe such as the STI regions in FIG. 8. FIGS. 9A and 9C are the same with FIGS. 7A and 7C. In FIG. 9B, an STI region 84 is formed on a channel region 82. The operation principle during an ESD event for the semiconductor device in FIG. 8 is substantially the same as that for the semiconductor device in FIG. 6.

Figure 10:
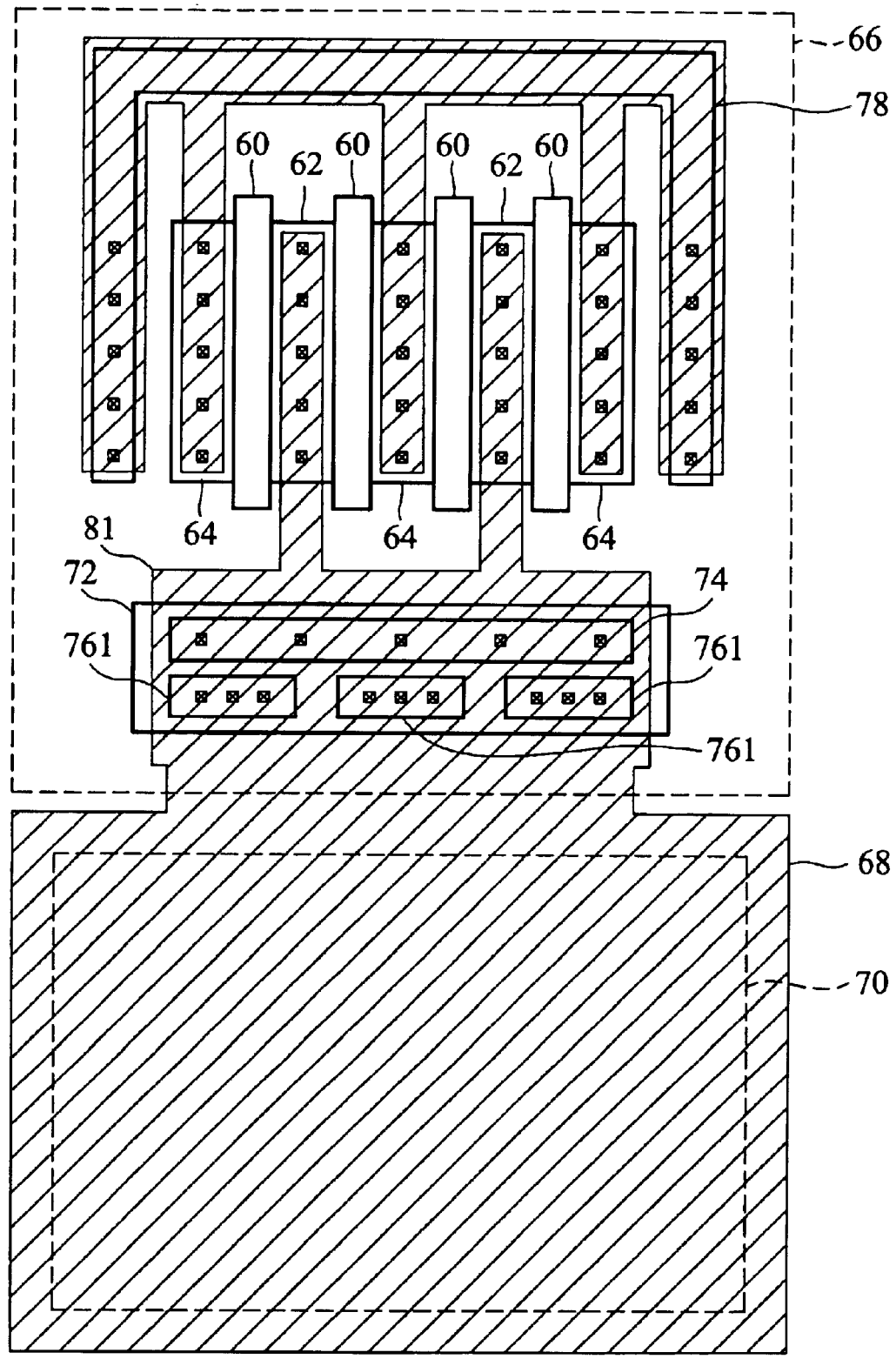
FIG. 10 depicts a layout of a third embodiment of the present invention.

The pattern in N-well stripe 72 can be altered. For example, FIG. 10 shows that one N+ region is divided into a number of separate N+ sub-regions 761. Separate N+ sub-regions 761 provide a contact region with less area than one N+ region 76 and forms a resistor with higher resistance to conduct the electron flow after parasitic BJTs go into snapback. This resistor with higher resistance will lower the SCR trigger current.

Figure 11:
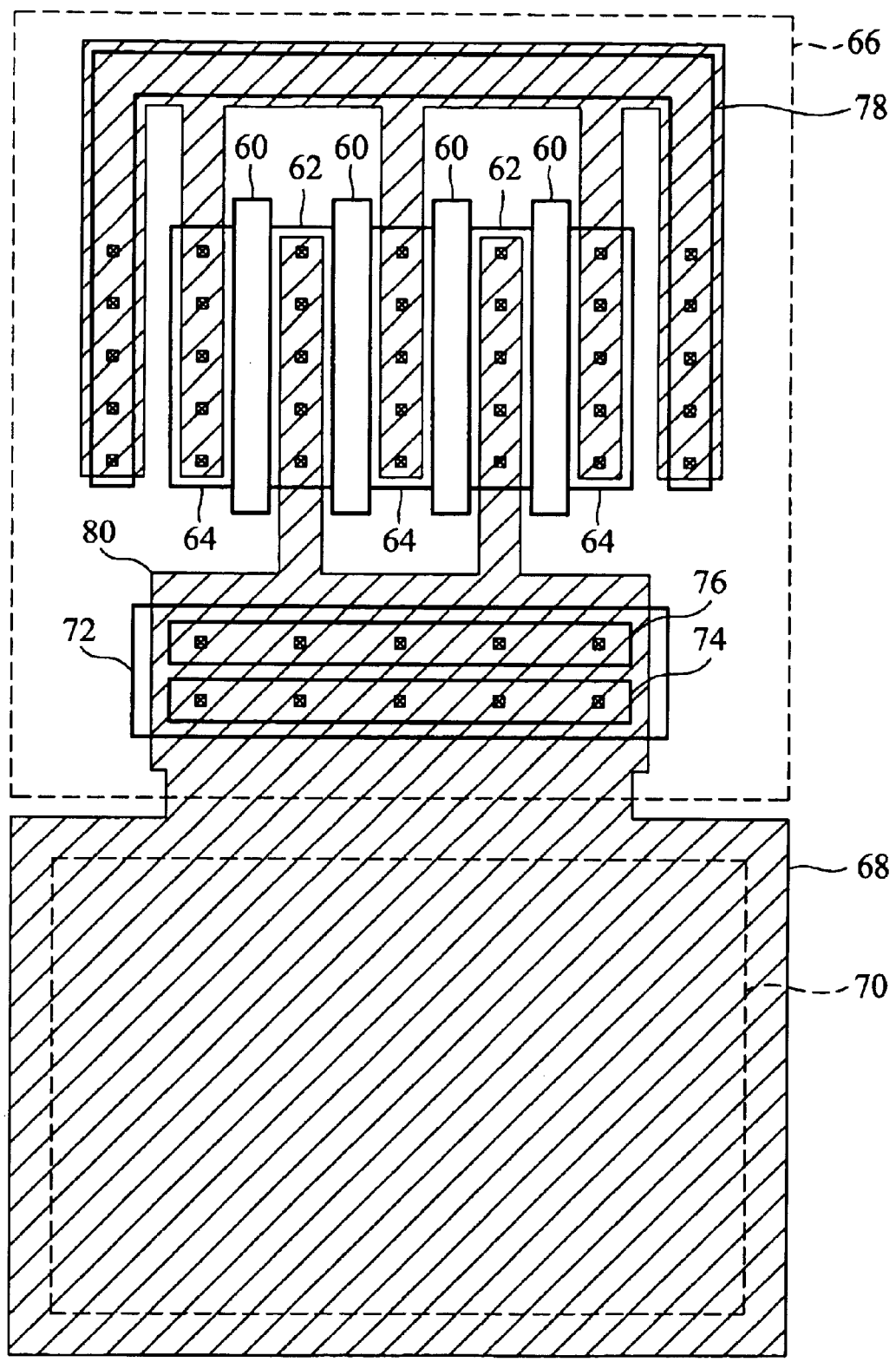
FIG. 11 depicts a layout of a fourth embodiment of the present invention.

FIG. 11 shows that the N+ region in the N-well stripe is closer to the finger-type NMOS than P+ region. In this way the semiconductor device in FIG. 11 will have higher SCR trigger current since N+ region 76 is located closer to source regions 64 of the finger-type NMOS.

Figure 12:
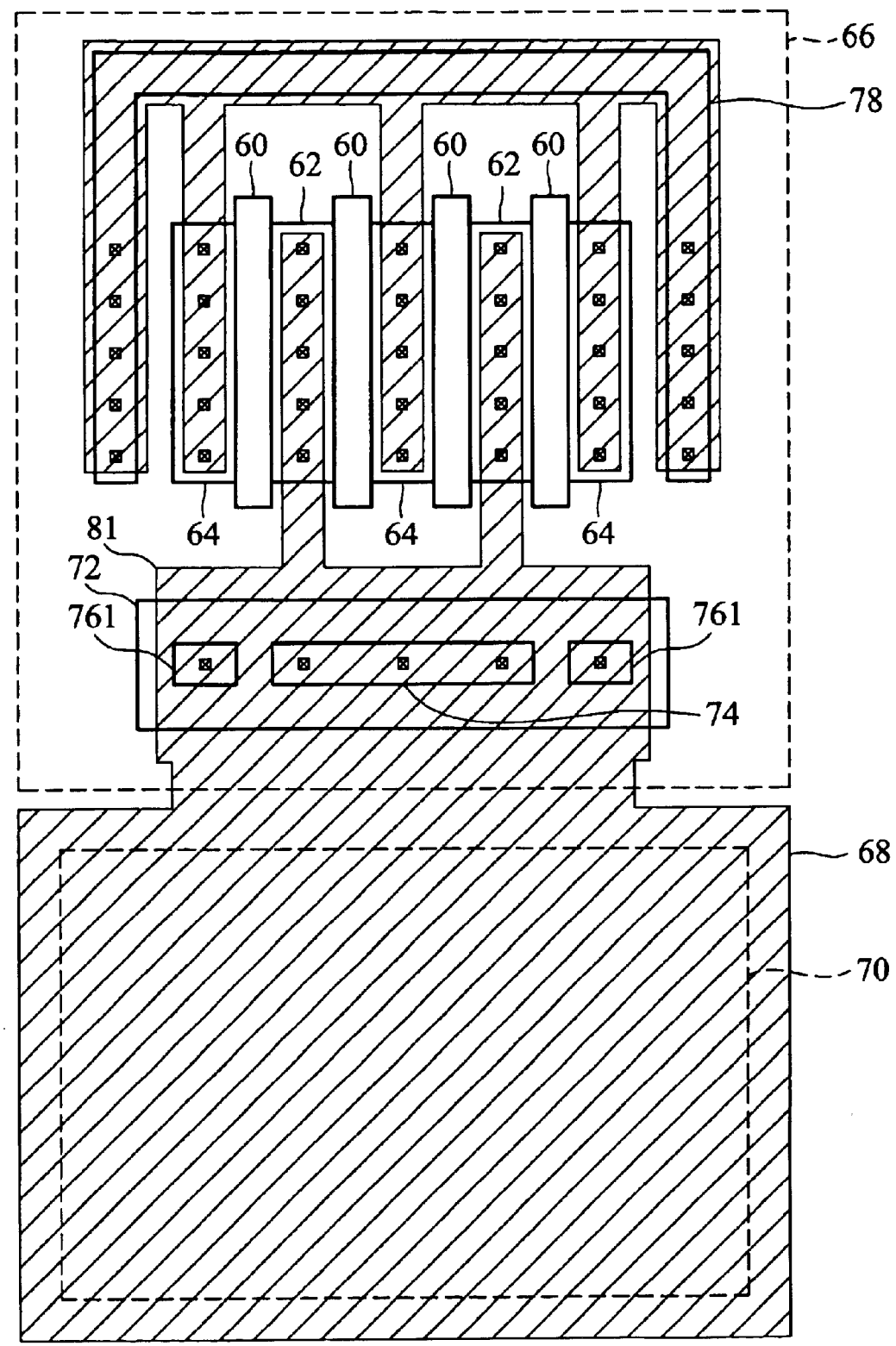
FIG. 12 depicts a layout of a fifth embodiment of the present invention.

As another alternative, FIG. 12 shows two N+ sub-regions 761 are disposed away from the two ends of P+ region 74. The SCR trigger current for turning on the parasitic SCRs in FIG. 12 will be lower than the embodiment of FIG. 11.

Figure 13:
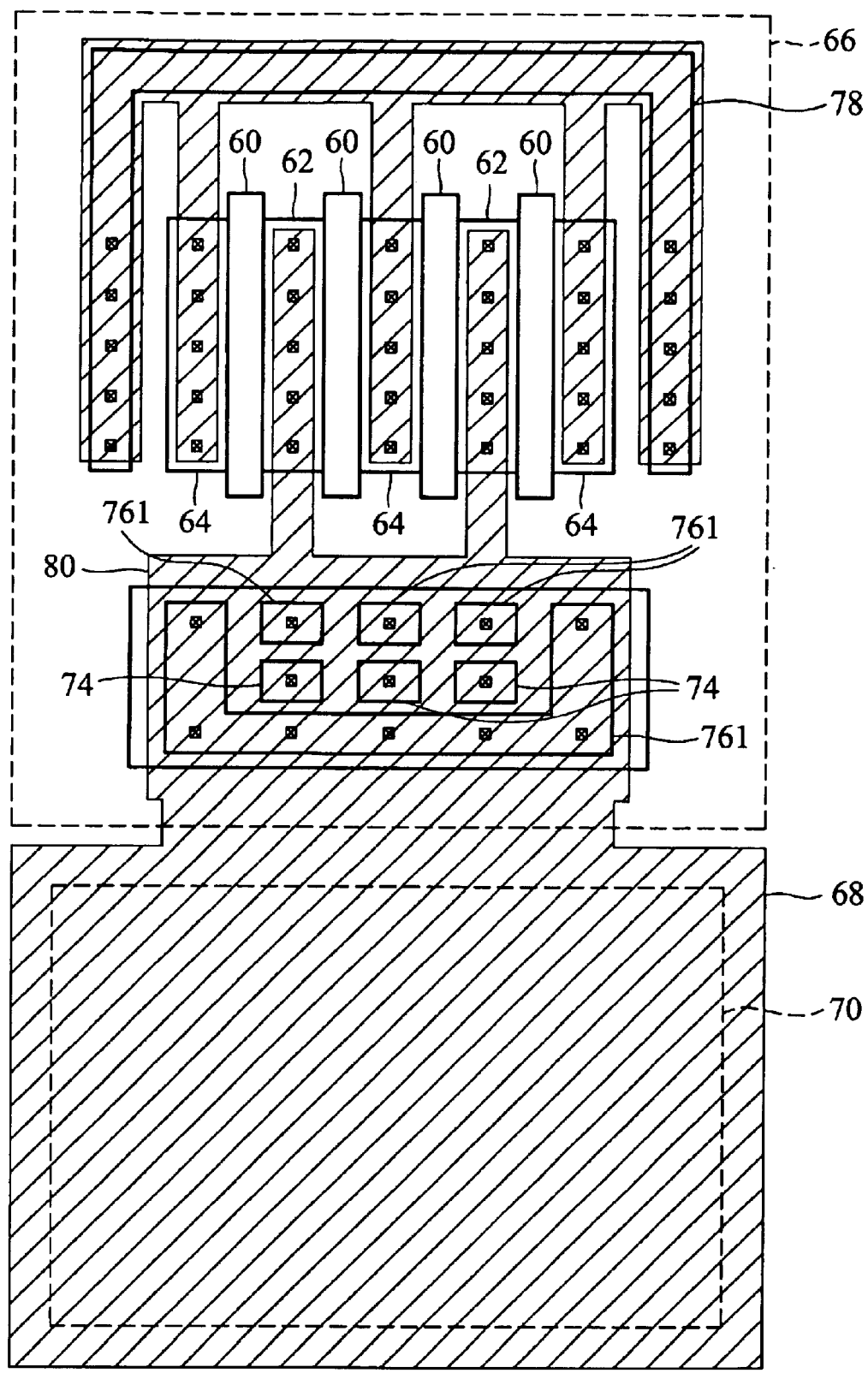
FIG. 13 depicts a layout of a sixth embodiment of the present invention.

FIG. 13 shows N+ sub-regions 761 can be extended to bound the p+ region 74 on two sides (left and right sides). Optionally, the N+ subregions 761 comprises a plurality of isolated island-like N+ regions distributed in the Nwell-stripe. Still optionally, the distributed N+ subregions 761 including a plurality of island-like N+ regions roughly surrounds the P+ region 74. This semiconductor device will have higher SCR trigger current than the exampled embodiment of FIG. 10 due to more extensive Nwell taps causing larger barrier to forward bias the p+ regions to nwell junctions.

As an option, FIG. 13 also shows that the p+ segment can be formed by a plurality of p+ regions distributed in the N-well stripe. This alternative distributed p+ regions can be applied to all p+ segments in all exampled embodiments.

Figure 14:
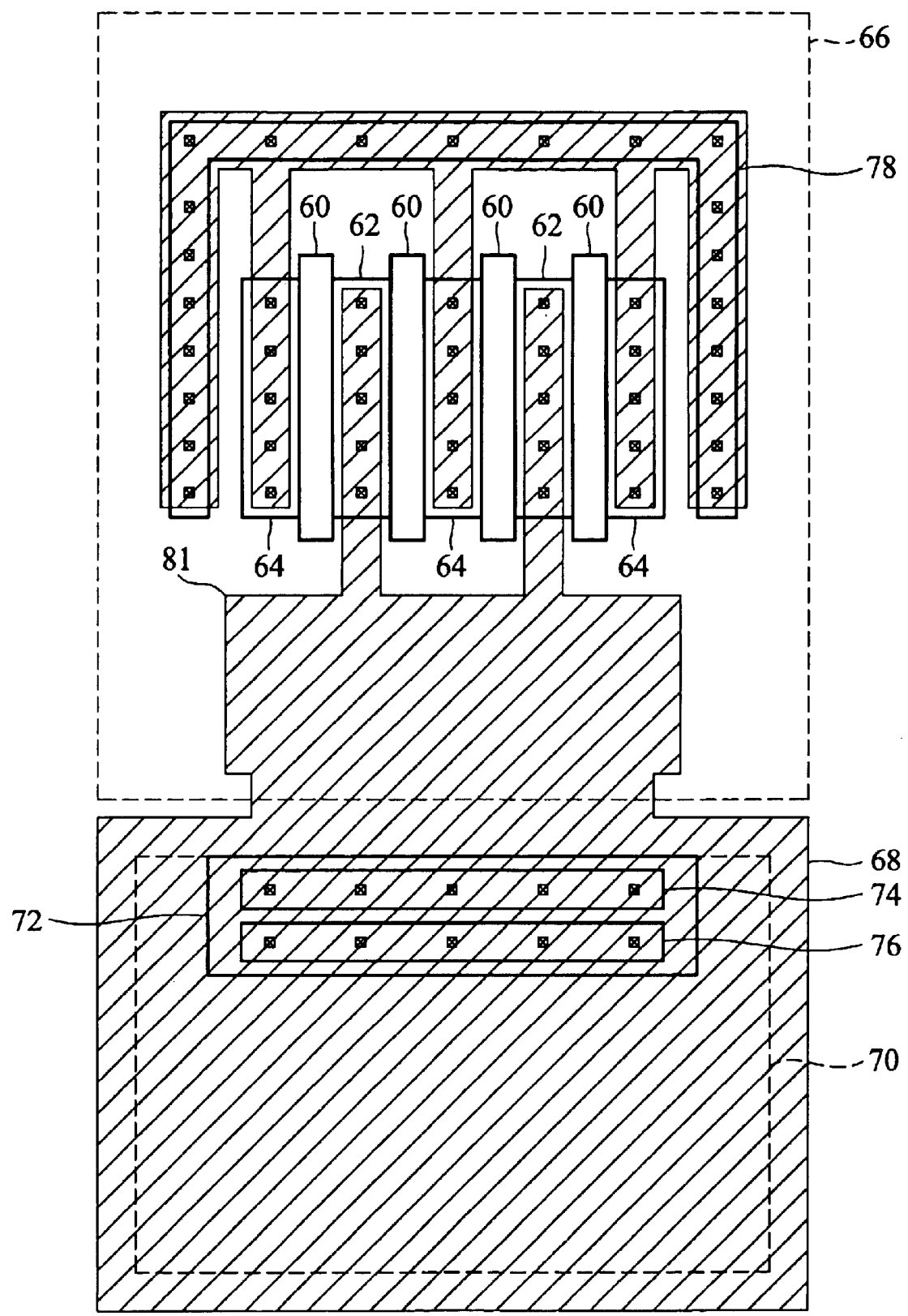
FIG. 14 depicts a layout of a seventh embodiment of the present invention.

FIG. 14 shows that N-well stripe 72 is under pad 68. As previously discussed, N-well stripe 72 with a potential short to a nearby pad is of no concern because it has already been shorted to the nearby pad. Therefore, N-well stripe 72 can be fully or partially formed under pad 68, as shown in FIG. 14. Each N-well stripe 72 in the previous embodiments can be located under pad 68 and will not be redundantly illustrated here.

Figure 15:
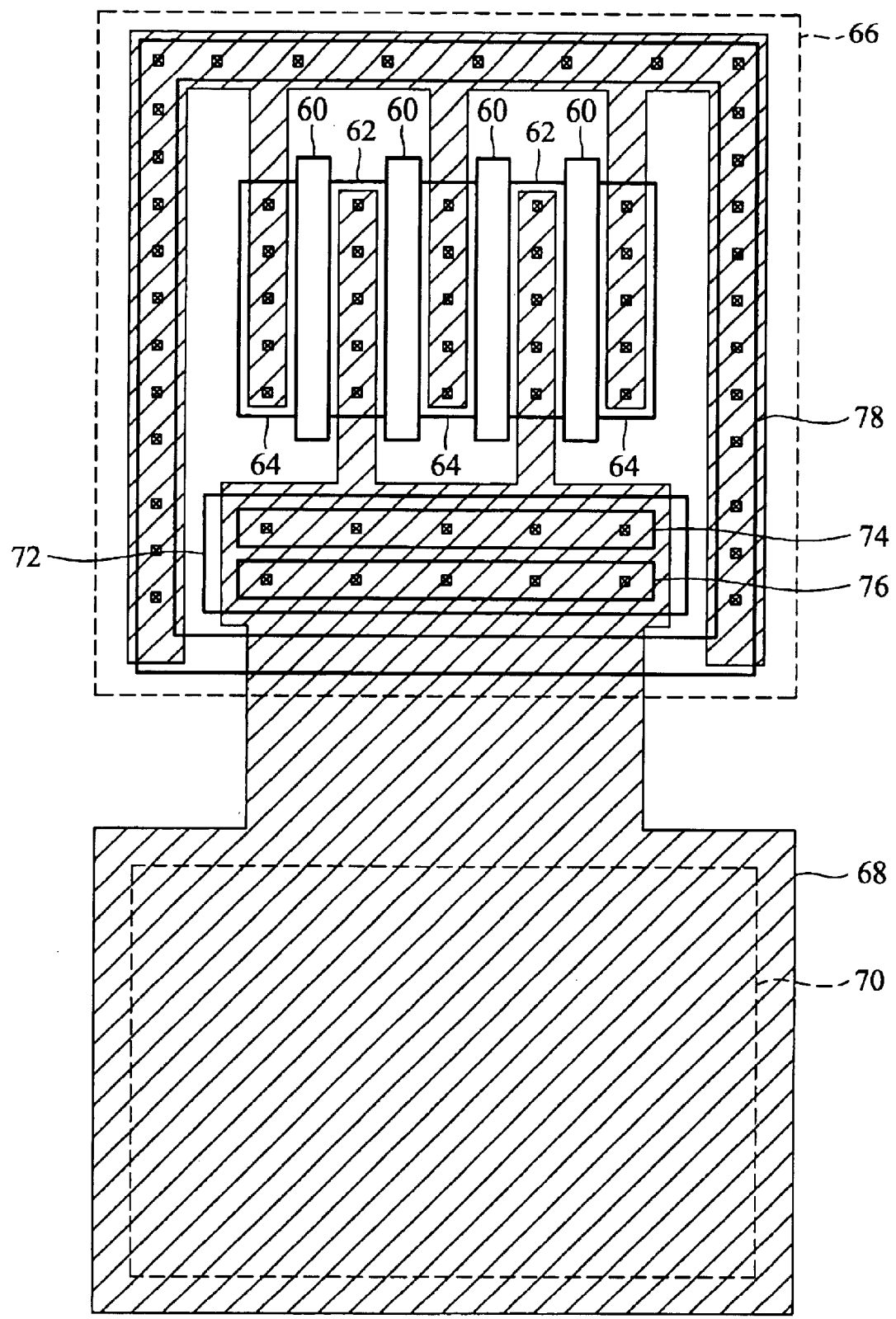
FIG. 15 depicts a layout of an eighth embodiment of the present invention.
Figure 16:
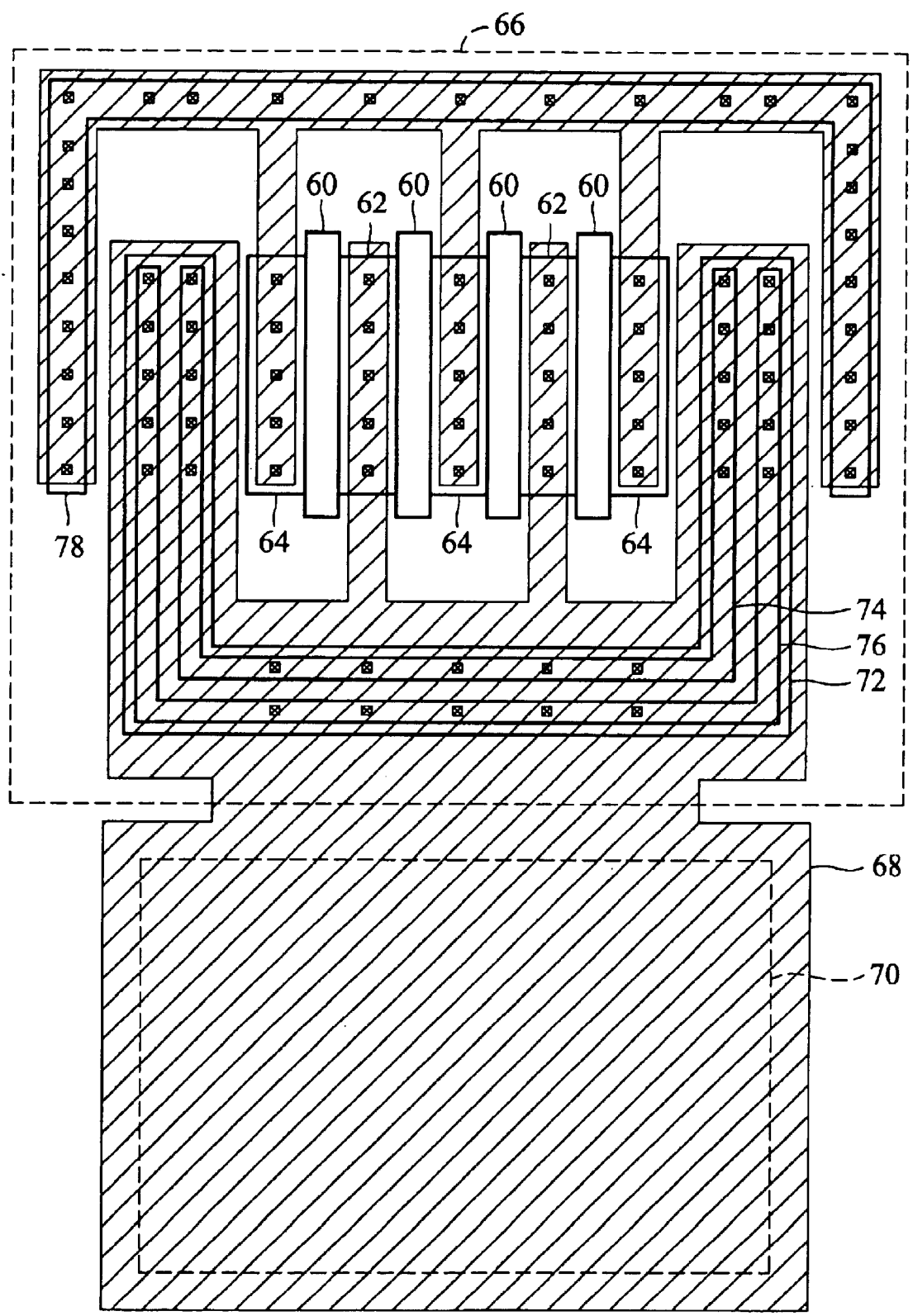
FIG. 16 depicts a layout of a ninth embodiment of the present invention.

The pattern of P+ pickup ring 78 can be altered. In FIG. 15A, P+ pickup ring 78 surrounds or encloses the finger-type NMOS and N-well stripe 72.

Alternatively, the N-well stripe 72 can be extended to substantially surround the finger-type NMOS, as shown in FIG. 17. The U-shaped N-well stripe 72 can be seen as three N-well stripes surrounding the finger-type NMOS. One is perpendicular to the gate fingers and the other two on each side of the finger-type NMOS. This arrangement reduces the SCR trigger current while being capable of absorbing greater ESD current during an ESD event. As exampled in FIG. 17, the three N-well stripes can be connected together.

Further more, the power rail can be a first power rail, and the pad as described in all figures can be a second power rail. As an example, the pad metal can be a VDD power-bus metal or a conductor connecting to a VDD power bus while the first power rail being a VSS power bus. In this case, the ESD protection device becomes a power-bus ESD protection device.

Finally, while the invention has been described by way of example and in terms of the preferred embodiment, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A semiconductor device with improved electrostatic discharge (ESD) tolerance, comprising:
   a pad on a semiconductor substrate of a first-conductive type;
   a finger-type transistor on the semiconductor substrate, comprising:
      at least one drain region of a second-conductive type, coupled to the pad;
      a plurality of source regions of the second-conductive type, coupled to a power rail; and
      a plurality of channel regions formed on the semiconductor substrate, each channel region located between one of the source regions and one of the at least one drain region;

a well stripe of the second-conductive type on the semiconductor substrate, extending in a first direction at an angle to a channel width direction of at least one of the channel regions; and a doped segment of the first-conductive type in the well stripe, coupled to the pad.

2. The semiconductor device as claimed in claim 1, wherein the angle is around 90°.

3. The semiconductor device as claimed in claim 1, wherein the doped segment is formed by a plurality of doped regions of the first conductivity type distributed in the well stripe.

4. The semiconductor device as claimed in claim 1, wherein the well stripe is located between the finger-type transistor and the pad.

5. The semiconductor device as claimed in claim 1, wherein the well stripe is located under the pad.

6. The semiconductor device as claimed in claim 1, wherein the finger-type transistor is a field-oxide transistor, the field-oxide transistor comprises a plurality of isolation segments, and each isolation segment overlaps one of the channel regions.

7. The semiconductor device as claimed in claim 1, wherein the semiconductor device further comprises a pickup ring of the first-conductive type on the semiconductor substrate, the pickup ring coupled to the power rail and extending around the finger-type transistor on three sides.

8. The semiconductor device as claimed in claim 7, wherein the pickup ring surrounds the finger-type transistor and the well stripe.

9. The semiconductor device as claimed in claim 1, wherein the finger-type transistor has gate fingers, each gate finger corresponding to one of the channel regions.

10. The semiconductor device as claimed in claim 9, wherein at least one of the gate fingers is coupled to the power rail.

11. The semiconductor device as claimed in claim 9, wherein at least one of the gate fingers is coupled to a signal line.

12. The semiconductor device as claimed in claim 1, wherein the well stripe is coupled to the pad.

13. The semiconductor device as claimed in claim 12, wherein the well has at least one contact region of the second-conductive type coupled to the pad.

14. The semiconductor device as claimed in claim 13, wherein the contact region is located between the doped segment and the finger-type transistor.

15. The semiconductor device as claimed in claim 13, wherein the doped segment is located between the contact region and the finger-type transistor.

16. The semiconductor device as claimed in claim 13, wherein the contact region is spaced apart from an end of the doped segment.

17. A pad Cell of a semiconductor integrated circuit, comprising:

a pad;

a transistor formed on a substrate of a first conductive type;

a conductor segment positioned between the pad and the transistor for coupling the pad and the transistor;

a well region of a second conductive type formed in the substrate and spaced apart from the transistor; and a first doped region disposed in the well region;

wherein the well region is positioned substantially under the conductor segment; and the first doped region is coupled to the conductor segment.

18. The cell as claimed in claim 17, wherein the first doped region is of the first conductive type.

19. The cell as claimed in claim 18, further comprising a second doped region of the second conductive type disposed in the well region and coupled to the conductor segment.

20. The cell as claimed in claim 19, wherein the first doped region is positioned substantially between the second doped region and the transistor.

21. The cell as claimed in claim 17, wherein the transistor is formed in an active region, the active region is substantially surrounded by an isolation region, and the well region is spaced apart from the active region by less than 20.1 um.

22. The cell as claimed in claim 21, wherein the well region is spaced apart from the active region by less than 5.1 um.

23. The cell as claimed in claim 22, wherein the well region is spaced apart from the active region by less than 2.1 um.

* * * * *